(12) United States Patent
Zhou (10) Patent No.: US 11,257,736 B2
(45) Date of Patent: Feb. 22, 2022

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 37 days.

(21) Appl. No.: 16/160,030

(22) Filed: Oct. 15, 2018

(65) Prior Publication Data
US 2019/0115280 A1 Apr. 18, 2019

(30) Foreign Application Priority Data
Oct. 16, 2017 (CN) .......................... 201710957371.2

(51) Int. Cl.
| | |
|---|---|
| *H01L 23/373* | (2006.01) |
| *H01L 29/66* | (2006.01) |
| *H01L 29/78* | (2006.01) |
| *H01L 21/76* | (2006.01) |
| *H01L 21/02* | (2006.01) |

(Continued)

(52) U.S. Cl.
CPC .... *H01L 23/3738* (2013.01); *H01L 21/02252* (2013.01); *H01L 21/76* (2013.01); *H01L 23/367* (2013.01); *H01L 29/0649* (2013.01); *H01L 29/6681* (2013.01); *H01L 29/66818* (2013.01); *H01L 29/7851* (2013.01)

(58) Field of Classification Search
CPC .................................................. H01L 29/66818
See application file for complete search history.

(56) References Cited

U.S. PATENT DOCUMENTS

| | | | | |
|---|---|---|---|---|
| 2004/0262687 | A1* | 12/2004 | Jung | ................... H01L 27/1203 257/347 |
| 2010/0147805 | A1* | 6/2010 | Ukai | ...................... B23H 1/022 219/69.13 |

(Continued)

*Primary Examiner* — Samuel A Gebremariam
*Assistant Examiner* — Jonas T Beardsley
(74) *Attorney, Agent, or Firm* — Anova Law Group, PLLC (57) ABSTRACT

A semiconductor structure and a method for fabricating the semiconductor structure are provided. The method includes forming an isolation layer on a substrate. The isolation layer includes an opening, and a bottom of the opening exposes the substrate. The method also includes forming a fin in the opening. The fin includes a heat-dissipation region and a channel region on the heat-dissipation region. Moreover, the fin includes forming an isolation structure by removing a thickness portion of the isolation layer. A surface of the isolation structure is coplanar with a surface of the heat-dissipation region of the fin. Further, the method includes forming a channel part from the channel region by performing a thinning process to reduce a width of the channel region of the fin using the isolation structure as a mask. The heat-dissipation region of the fin forms a heat-dissipation part.

19 Claims, 7 Drawing Sheets

(51) Int. Cl.
*H01L 29/06* (2006.01)
*H01L 23/367* (2006.01)

(56) References Cited

U.S. PATENT DOCUMENTS

| | | | |
|---|---|---|---|
| 2010/0247805 A1* | 9/2010 | Kabe | H01L 21/02252 427/575 |
| 2013/0307021 A1* | 11/2013 | Ching | H01L 21/823878 257/190 |
| 2015/0200252 A1* | 7/2015 | Ching | H01L 29/0847 257/510 |
| 2019/0019891 A1* | 1/2019 | Glass | H01L 29/0673 |
| 2019/0019897 A1* | 1/2019 | Qin | H01L 29/42384 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710957371.2, filed on Oct. 16, 2017, the entirety of which is incorporated herein by reference.

FIELD OF THE DISCLOSURE

The present disclosure generally relates to the field of semiconductor manufacturing technology and, more particularly, relates to a semiconductor structure and fabrication method thereof.

BACKGROUND

With the rapid development of semiconductor manufacturing technology, semiconductor devices have been developed toward with higher component density and higher integration degree. As the component density and the integration degree of the semiconductor devices increase, dimensions of a transistor are scaled down. The reduction of the dimensions of the transistor makes a short-channel effect more prominent.

A fin field effect transistor (FinFET) has been developed to reduce the short-channel effect. A gate of the FinFET has a fork-shaped three-dimensional structure similar to a fin. The gate of the FinFET can control on and off of a circuit from multiple sides of the fin to effectively suppress the short-channel effect of the transistor. As the dimensions of the transistor decrease, a width of the fin of the FinFET decreases accordingly, resulting in poor heat-dissipation performance of the fin.

Therefore, the heat-dissipation performance of a conventionally formed semiconductor structure needs to be improved. The disclosed methods and device structures are directed to solve one or more problems set forth above and other problems in the art.

BRIEF SUMMARY OF THE DISCLOSURE

One aspect of the present disclosure includes a method for fabricating a semiconductor structure. The method includes forming an isolation layer on a substrate. The isolation layer includes an opening, and a bottom of the opening exposes the substrate. The method also includes forming a fin in the opening. The fin includes a heat-dissipation region and a channel region on the heat-dissipation region. Moreover, the fin includes forming an isolation structure by removing a thickness portion of the isolation layer. A surface of the isolation structure is coplanar with a surface of the heat-dissipation region of the fin. Further, the method includes forming a channel part from the channel region by performing a thinning process to reduce a width of the channel region of the fin using the isolation structure as a mask. The heat-dissipation region of the fin forms a heat-dissipation part.

Another aspect of the present disclosure includes a semiconductor structure. The semiconductor structure includes a fin heat-dissipation region on a substrate. The semiconductor structure also includes a fin channel part on the fin heat-dissipation region. A width of the fin channel part is smaller than a width of the fin heat-dissipation region. Further, the semiconductor structure includes an isolation structure on the substrate. A surface of the isolation structure is coplanar with a top surface of the fin heat-dissipation region.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
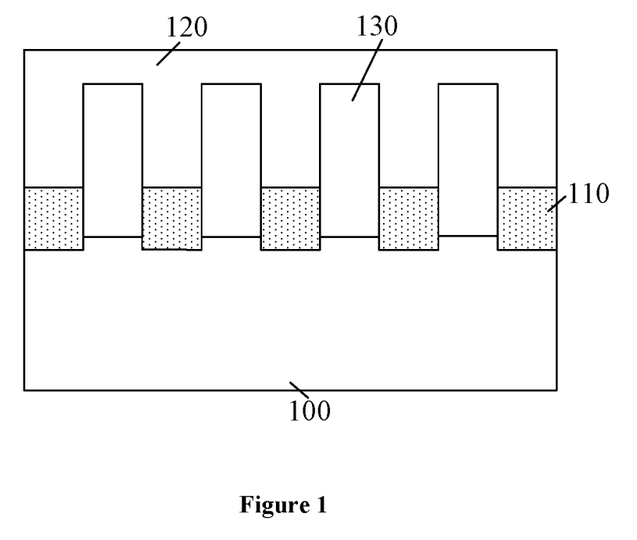
FIG. 1 illustrates a structural schematic of a semiconductor structure.

FIG. 1 illustrates a structural schematic of a semiconductor structure. Referring to FIG. 1, the semiconductor structure includes a substrate 100 having a fin 130 on the substrate 100, an isolation structure 110 on the substrate 100, and a gate structure 120 across a length portion of the fin 130. The isolation structure 110 covers a portion of sidewalls of the fin 130. The gate structure 120 covers a portion of each of the sidewall and top surfaces of the fin 130.

The fin 130 is made of silicon germanium, or a single crystal formed by one or more Group III-V elements. Silicon germanium or the single crystal formed by one or more Group III-V elements can increase the mobility of carriers in the fin 130. In addition, to enable the fin 130 above the isolation structure 110 to be easily reversed after turning on the channel to increase the control effect of the gate structure 120 over the carriers in the channel, a width of the fin 130 is substantially small.

However, due to the small width of the fin 130, the contact area between the fin 130 and the substrate 100 is substantially small, and heat generated in the fin 130 is not easily released through the fin 130 and the substrate 100. In addition, the heat-dissipation performance of silicon germanium or the single crystal formed by one or more Group III-V elements is poor, and, thus, the heat generated in the fin 130 is not easily released, and a self-heating effect of the semiconductor structure is substantially severe.

The present disclosure provides a semiconductor structure and a method for forming the semiconductor structure. A channel part may be formed by performing a thinning process on a channel region of a fin using an isolation structure as a mask to reduce a width of the channel region of the fin. A heat-dissipation part may be formed from a heat-dissipation region of the fin. The heat-dissipation part with a substantially large width may increase the release of heat generated in the channel part, thereby improving the heat-dissipation performance of the formed semiconductor structure.

Figure 12:
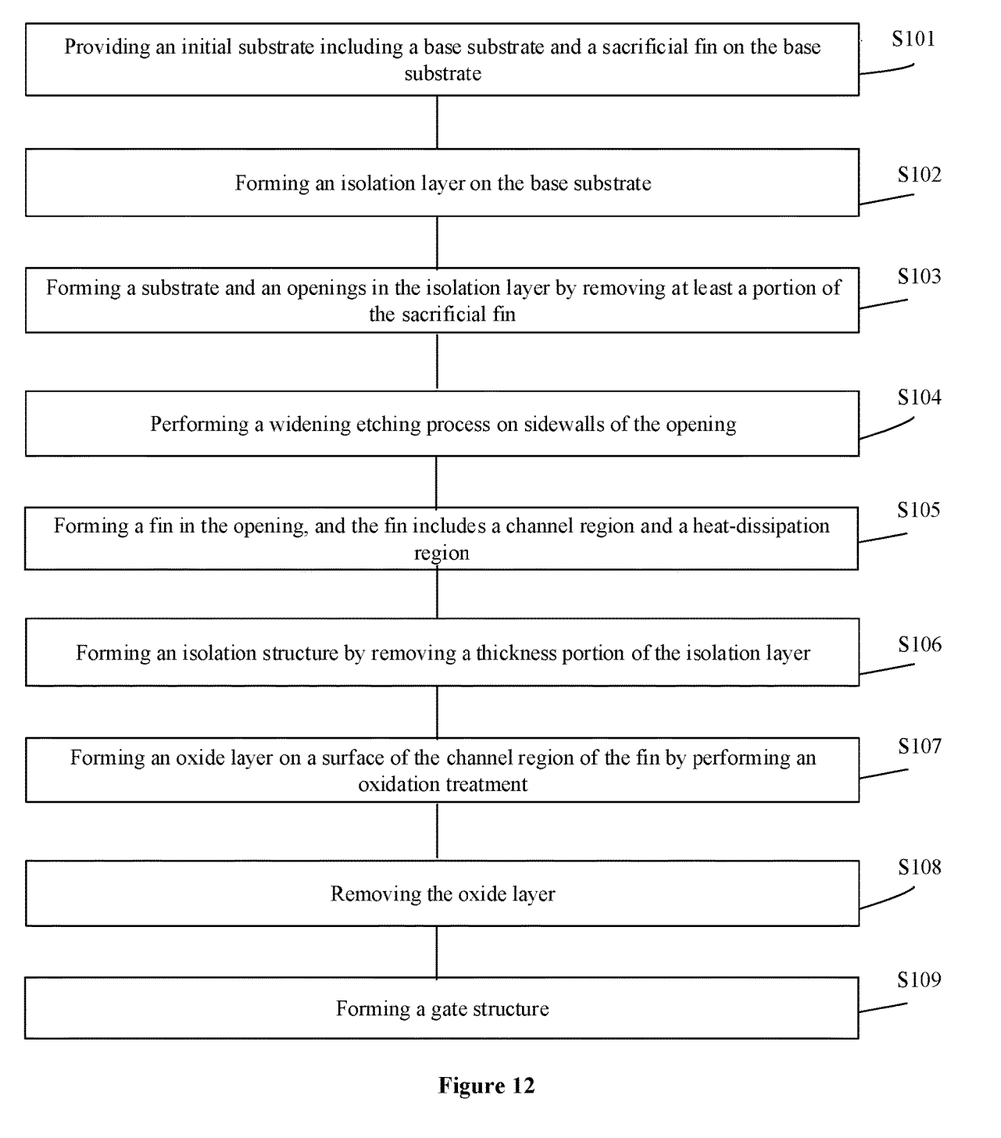
FIG. 12 illustrates an exemplary fabrication method for forming a semiconductor structure consistent with various disclosed embodiments of the present disclosure.

FIG. 12 illustrates an exemplary fabrication method for forming a semiconductor structure consistent with various disclosed embodiments of the present disclosure; and FIGS. 2-10 illustrate semiconductor structures corresponding to certain stages of the exemplary fabrication method.

A substrate may be provided, and an isolation layer may be formed on the substrate. The isolation layer may include opening having a bottom exposing the substrate. In one embodiment, forming the substrate and the isolation layer may refer to FIGS. 2-4.

Figure 2:
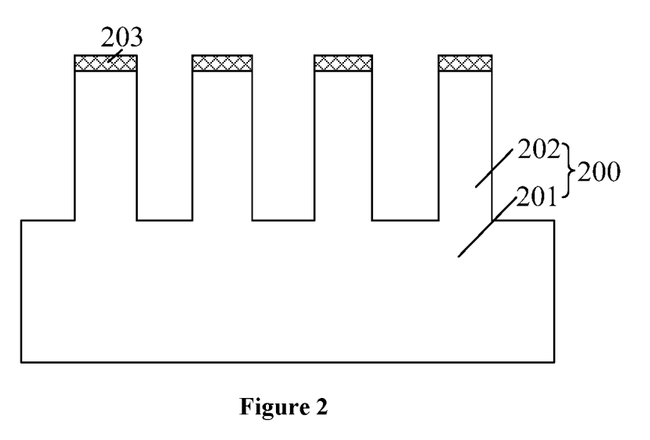
FIGS. 2-10 illustrate semiconductor structures corresponding to certain stages for forming an exemplary semiconductor structure consistent with various disclosed embodiments of the present disclosure.

As shown in FIG. 12, at the beginning of the fabrication method, an initial substrate with certain structures may be provided (S101). FIG. 2 illustrates a corresponding semiconductor structure.

Referring to FIG. 2, an initial substrate 200 may be provided. The initial substrate 200 may include a base substrate 201 and a sacrificial fin 202 on the base substrate 201. The initial substrate 200 may be used to subsequently form a substrate, and the sacrificial fin 202 may be used to define a position of a subsequently formed fin.

Forming the initial substrate 200 may include providing an initial base substrate, forming a patterned mask layer 203 on the initial base substrate; and etching the initial base substrate using the patterned mask layer 203 as a mask to form the base substrate 201 and the sacrificial fin 202 on the base substrate 201.

The base substrate 201 and the sacrificial fin 202 may be made of silicon. In another embodiment, the base substrate and the sacrificial fin may be made of germanium, silicon germanium, silicon carbide, or a single crystal formed by one or more Group III-V elements. The single crystal formed by one or more Group III-V elements may include InAs, GaAs, InGaAs, InAs, InAlAs, or InP, etc. The mask layer 203 may be made of silicon nitride, silicon oxynitride, or silicon oxide, etc.

In one embodiment, etching the initial base substrate may include an anisotropic dry etching process. The anisotropic dry etching process may have a longitudinal etching rate greater than a lateral etching rate, such that the formed sacrificial fin 202 may have desired perpendicularity to a surface of the base substrate 201. In another embodiment, etching the initial base substrate may include a wet etching process, or an isotropic dry etching process, etc.

In one embodiment, the number of the sacrificial fins 202 may be more than one. In certain embodiments, the number of the sacrificial fins may be one. In one embodiment, the sacrificial fin 202 may have a long-bar shape.

A distance between adjacent sacrificial fins 202 may be a distance between centers of the adjacent sacrificial fins 202. A spacing between adjacent sacrificial fins 202 may be a distance between adjacent sidewalls of the adjacent sacrificial fins 202.

In one embodiment, to increase integration degree of the formed semiconductor structure, the distance between adjacent sacrificial fins 202 may be substantially small. In addition, during a subsequent formation of an isolation layer, to enable the isolation layer to sufficiently fill gaps between the adjacent sacrificial fins 202, the spacing between adjacent sacrificial fins 202 may not be too small. Therefore, a width of the sacrificial fin 202 may be substantially small. In one embodiment, the distance between adjacent sacrificial fins 202 may be in a range of approximately 25 nm-50 nm, and the width of the sacrificial fin 202 may be in a range of approximately 8 nm-15 nm.

Figure 3:
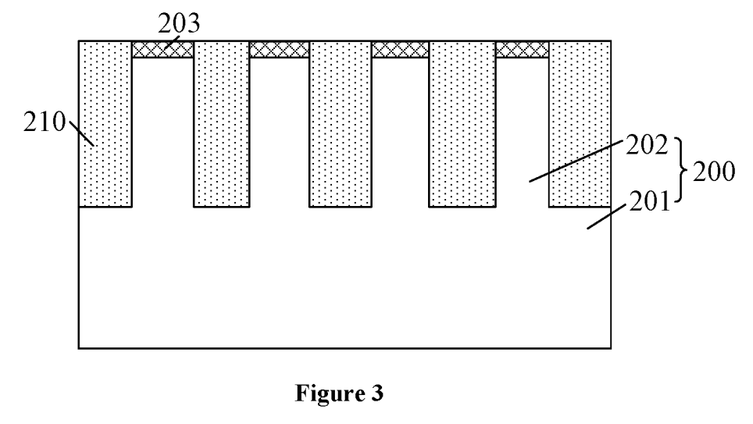

Returning to FIG. 12, after providing the initial substrate, an isolation layer may be formed (S102). FIG. 3 illustrates a corresponding semiconductor structure.

Referring to FIG. 3, an isolation layer 210 may be formed on the base substrate 201. The isolation layer 210 may cover sidewalls of the sacrificial fin 202 and may expose a top of the sacrificial fin 202.

During a subsequent formation of a fin, the isolation layer 210 may be used to define the position and size of the fin. The isolation layer 210 may be used to subsequently form an isolation structure. In one embodiment, the isolation layer 210 may expose a surface of the mask layer 203.

In one embodiment, the isolation layer 210 may be made of silicon oxide. In another embodiment, the isolation layer may be made of silicon oxynitride. Forming the isolation layer 210 may include forming an initial isolation layer on the base substrate 201, where a surface of the initial isolation layer may be above the top surface of the sacrificial fin 202; and performing a planarization process on the initial isolation layer to enable the isolation layer 210 to expose the mask layer 203.

Forming the initial isolation layer may include a fluid chemical vapor deposition process. The fluid chemical vapor deposition process may include forming a precursor on the base substrate 201; and curing the precursor by performing a curing process on the precursor to form the initial isolation layer. The precursor may be a fluid capable of sufficiently filling the gaps between adjacent sacrificial fins 202, such that the initial isolation layer with desired isolation performance may be formed. In another embodiment, forming the initial isolation layer may include a high density plasma enhanced chemical deposition process, a high aspect-ratio deposition process, or a physical vapor deposition process, etc. The planarization process may include a chemical mechanical polishing process.

Figure 4:
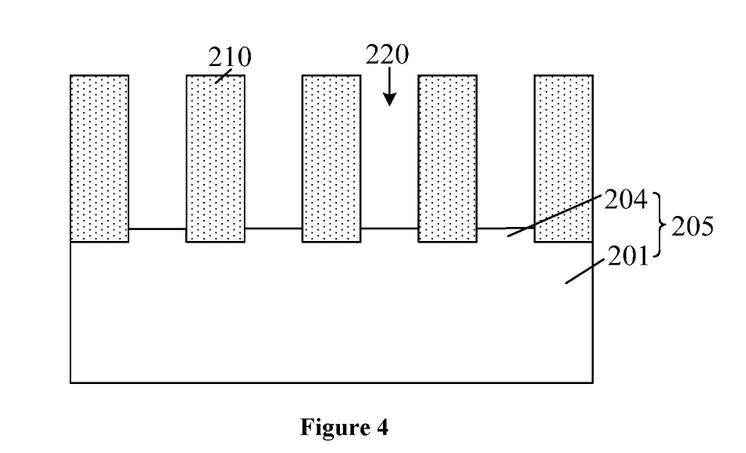

Returning to FIG. 12, after forming the isolation layer, a substrate and an opening may be formed (S103). FIG. 4 illustrates a corresponding semiconductor structure.

Referring to FIG. 4, at least a portion of the sacrificial fin 202 may be removed by etching the initial substrate 200 (illustrated in FIG. 3) using the isolation layer 210 as a mask to form a substrate 205 and an opening 220 in the isolation layer 210. The opening 220 may be used to accommodate a subsequently formed fin.

Etching the initial substrate 200 may include a dry etching process. In another embodiment, etching the initial substrate may include a wet etching process.

If a depth of the opening 220 is too small, a height of a subsequently formed heat-dissipating portion may be substantially small, such that the heat-dissipation performance of the formed semiconductor structure may not be effectively improved. In addition, the too small depth of the opening 220 may lead to many defects in a subsequently formed channel region of the fin. If the depth of the opening 220 is too large, process difficulty may easily increase. In one embodiment, the depth of the opening 220 may be in a range of approximately 800 Å-2000 Å.

Before subsequently performing a widening etching process, a width of the opening 220 may be the same as the width of the sacrificial fin 202. In one embodiment, before subsequently performing the widening etching process, the width of the opening 220 may be in a range of approximately 8 nm-15 nm. The width of the opening 220 may refer to a dimension of the opening 220 along a direction parallel to the base substrate 201 and perpendicular to a length direction of the opening 220.

In one embodiment, the substrate 205 may include the base substrate 201 and remaining sacrificial fin 202 on the base substrate 201. In another embodiment, the substrate may not include the sacrificial fin.

In one embodiment, after removing the portion of the sacrificial fin 202, the remaining sacrificial fin 202 may form a fin substrate 204, and the fin substrate 204 and the base substrate 201 may form the substrate 205. In another embodiment, the entire sacrificial fin may be removed, and, thus, the base substrate may form the substrate.

In certain embodiments, forming the substrate and the isolation layer may include providing a substrate, forming an initial isolation layer on the substrate; and etching a portion of the initial isolation layer to form the isolation layer and the opening in the isolation layer.

Figure 5:
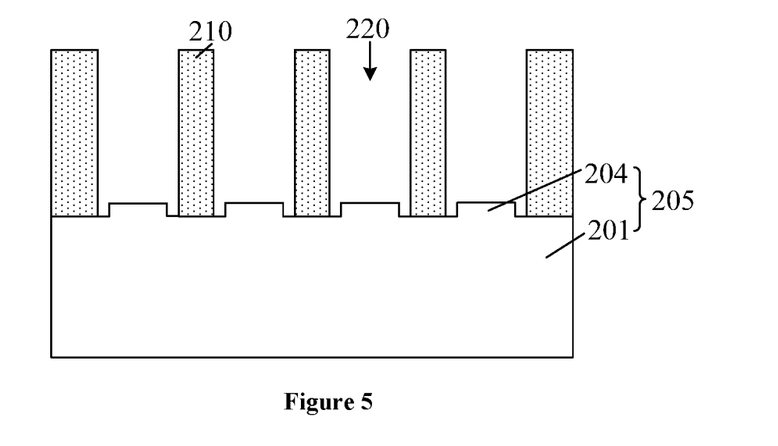

Returning to FIG. 12, after forming the substrate and the opening, a widening etching process may be performed (S104). FIG. 5 illustrates a corresponding semiconductor structure.

Referring to FIG. 5, a widening etching process may be performed on sidewalls of the opening 220 to increase the width of the opening 220. The widening etching process may be used to increase the width of the opening 220, and, thus, to increase a width of a subsequently formed heat-dissipation part. The width of the opening may refer to the dimension of the opening along the direction parallel to the base substrate 201 and perpendicular to the length direction of opening 220.

The widening etching process may include a wet etching process, or an isotropic dry etching process, etc. The wet etching process and the isotropic dry etching process each may have a lateral etching rate similar to a longitudinal etching rate, such that the sidewalls of the opening 220 may be etched.

After performing the widening etching process, if the width of the opening 220 is too small, a width of a subsequently formed fin may be too small, and a width of the heat-dissipation part may be substantially small, which may not effectively increase the heat-dissipation performance of the formed semiconductor structure. After performing the widening etching process, if the width of the opening 220 is too large, a spacing between subsequently formed adjacent heat-dissipation parts may be too small, and, thus, the isolation layer 210 between the adjacent heat-dissipation parts may be easily broken down. In one embodiment, after performing the widening etching process, the width of the opening 220 may be in a range of approximately 10 nm-25 nm. In certain embodiments, if the width of the sacrificial fin is substantially large, the widening etching process may not be performed on the sidewalls of the opening.

Figure 6:
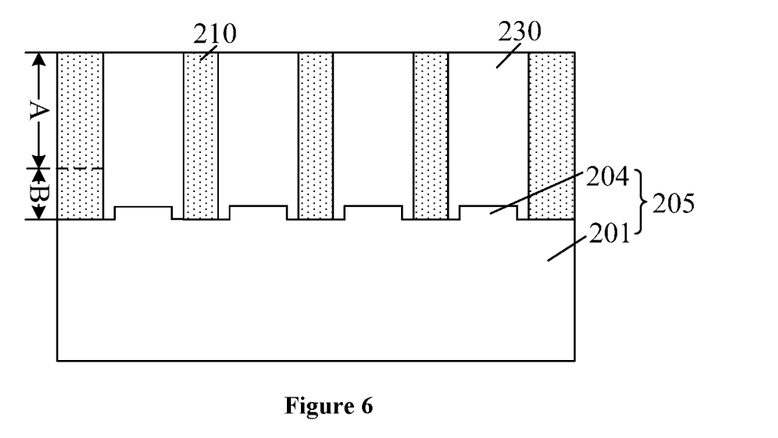

Returning to FIG. 12, after performing the widening etching process, a fin may be formed (S105). FIG. 6 illustrates a corresponding semiconductor structure.

Referring to FIG. 6, a fin 230 may be formed in the opening 220 (illustrated in FIG. 5). The fin 230 may include a heat-dissipation region B and a channel region A on the heat-dissipation region B.

In one embodiment, the formed semiconductor structure may be a transistor, and the fin 230 may be subsequently used to form a channel of the semiconductor structure. In another embodiment, the semiconductor structure may be a diode, or a triode, and the fin may be used to form an electrode of the diode, or the triode.

The heat-dissipation region B of the fin 230 may be used to subsequently form a heat-dissipation part to release the heat generated in the channel region A of the fin 230. Therefore, the self-heating effect of the formed semiconductor structure may be reduced, and the performance of the semiconductor structure may be improved.

If a height of the channel region A of the fin 230 is too small, a cross-sectional area of the channel of the formed semiconductor structure may be reduced, and a channel resistance may increase. If the height of the channel region A of the fin 230 is too large, a height of the fin 230 may have to be substantially large, and the process difficulty may easily increase. In one embodiment, the height of the channel region A of the fin 230 may be in a range of approximately 300 Å-600 Å.

If a height of the heat-dissipation region B of the fin 230 is too small, the heat-dissipation performance of the formed semiconductor structure may not be effectively improved, and defects in the channel region A of the fin 230 may increase. If the height of the heat-dissipation region B of the fin 230 is too large, the height of the fin 230 may have to be substantially large, and the process difficulty may easily increase. In one embodiment, the height of the heat-dissipation region B of the fin 230 may be in a range of approximately 200 Å-1000 Å.

The fin 230 may be made of silicon germanium, or a single crystal formed by one or more Group III-V elements. The single crystal formed by one or more Group III-V elements may include InAs, GaAs, InGaAs, InAs, InAlAs, or InP, etc. In one embodiment, the fin 230 may be made of silicon germanium.

Silicon germanium may have a substantially large hole mobility, and the single crystal formed by one or more Group III-V elements may have a substantially large electron mobility. Therefore, silicon germanium or the single crystal formed by one or more Group III-V elements may increase a switching rate of the formed semiconductor structure, and improve the performance of the semiconductor structure.

Forming the fin 230 may include an epitaxial growth process. In one embodiment, process parameters for forming the fin 230 may include the following. Reaction gases may include a silicon source gas, a germanium source gas, and a carrier gas. The silicon source gas may include dichlorosilane (DCS), $SiH_4$, or $Si_2H_6$, etc. The gallium source gas may include $GeH_4$, or $Ge_2H_6$, etc. The carrier gas may include $H_2$, or $N_2$, etc.

Figure 7:
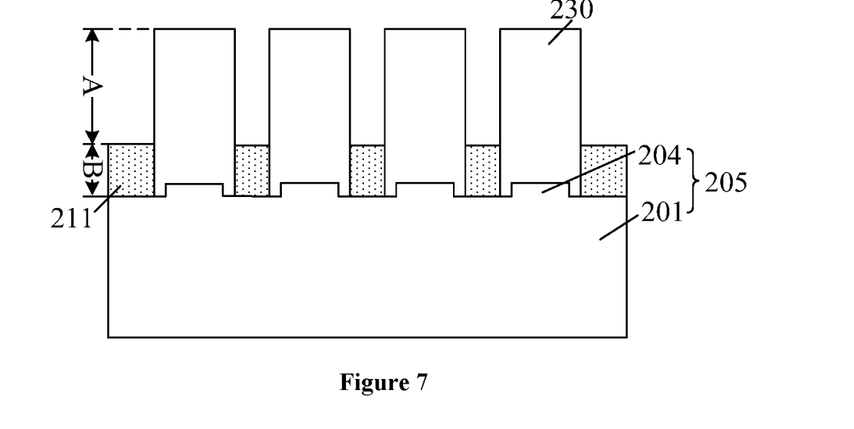

Returning to FIG. 12, after forming the fin, an isolation structure may be formed (S106). FIG. 7 illustrates a corresponding semiconductor structure.

Referring to FIG. 7, an isolation structure 211 may be formed by removing a thickness portion of the isolation layer 210 (illustrated in FIG. 6) along a direction perpendicular to the surface of the base substrate 201. A surface of the isolation structure 211 may be coplanar with a surface of the heat-dissipation region B of the fin 230. Removing the thickness portion of the isolation layer 210 may include a dry etching process, or a wet etching process, etc.

The isolation structure 211 may be used to electrically isolate adjacent heat-dissipation parts. The isolation structure 211 may also be used to protect the heat-dissipation region B of the fin 230 in a subsequent thinning process to ensure the heat-dissipation region to have a substantially large width. The isolation structure 211 may expose sidewalls of the channel region A of the fin 230, and cover sidewalls of the heat-dissipation region B of the fin 230.

A thinning process may be performed on the channel region A of the fin 230 using the isolation structure 211 as a mask to reduce the width of the channel region A of the fin 230. Therefore, a channel part may be formed from the channel region A of the fin 230, and a heat-dissipation part may be formed from the heat-dissipation region B of the fin 230. The width of the fin 230 may refer to the dimension of the fin 230 along the direction parallel to the surface of the base substrate 201 and perpendicular to the length direction of the fin 230.

Figure 8:
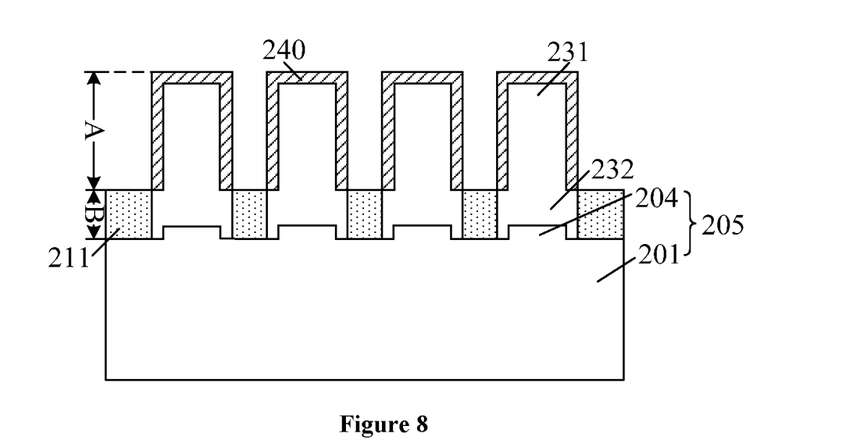

Returning to FIG. 12, after forming the isolation structure, an oxidation treatment may be performed on the channel region of the fin (S107). FIG. 8 illustrates a corresponding semiconductor structure.

Referring to FIG. 8, an oxidation treatment may be performed on the channel region A of the fin 230 (illustrated in FIG. 7) to form a channel part 231 and an oxide layer 240 on a surface of the channel part 231. A heat-dissipation part 232 may be formed from the heat-dissipation region B of the fin 230.

The oxidation treatment may be used to oxidize the channel region A of the fin 230, thereby increasing an etching selectivity ratio of the oxide layer 240 over the channel part 231 during the subsequent removal of the oxide layer 240.

If a thickness of the oxide layer 240 is too large, the width of the channel part 231 may be too small after performing the oxidation treatment, and, thus, a width of the channel of the formed semiconductor structure may be too small, thereby affecting the performance of the formed semiconductor structure. If the thickness of the oxide layer 240 is too small, the subsequently formed gate structure may not effectively control the channel. In one embodiment, the thickness of the oxide layer 240 may be in a range of approximately 5 Å-30 Å, and the width of the channel part 231 may be in a range of approximately 8 nm-15 nm.

In one embodiment, the oxidation treatment may include a plasma oxidation treatment. The thickness of the oxide layer 240 formed by the plasma oxidation treatment may be easily controlled. In another embodiment, the oxidation treatment may include a thermal oxidation treatment, or a rapid thermal oxidation treatment, etc.

In one embodiment, process parameters of the oxidation treatment may include the following. Reactants may include $N_2$ and $O_2$, an etching temperature may be in a range of approximately 700° C.-1000° C., an etching duration may be in a range of approximately 8 seconds-200 seconds, a gas pressure may be in a range of approximately 50 torr-300 torr, and a flow ratio of $O_2$ over $N_2$ may be in a range of approximately 1/20-1/5.

In one embodiment, the fin 230 (illustrated in FIG. 7) may be made of silicon germanium, and the oxide layer 240 may be made of silicon germanium oxide. In one embodiment, after performing the oxidation treatment, the heat-dissipation part 232 may be formed from the heat-dissipation region B of the fin 230 (illustrated in FIG. 7).

Figure 9:
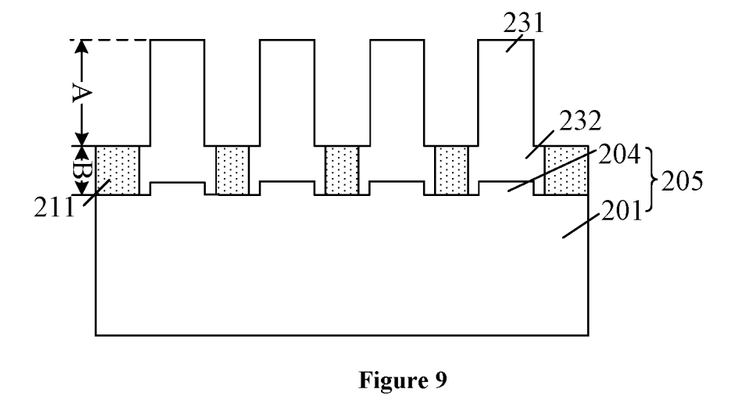

Returning to FIG. 12, after performing the oxidation treatment, the oxide layer may be removed (S108). FIG. 9 illustrates a corresponding semiconductor structure.

Referring to FIG. 9, the oxide layer 240 (illustrated in FIG. 8) may be removed. Removing the oxide layer 240 may include one or more of a wet etching process and an isotropic dry etching process.

In one embodiment, during the oxidation treatment, the top of the fin 230 may be oxidized to form the oxide layer 240. After removing the oxide layer 240, a height of the channel part 231 may be less than the height of the channel region A of the fin 230 before performing the oxidation treatment. In one embodiment, the height of the channel part 231 may be in a range of approximately 300 Å-600 Å.

In one embodiment, the thinning process may include performing the oxidation treatment on the channel region A of the fin 230 to form the channel part 231 and the oxide layer 240 on the surface of the channel part 231; and removing the oxide layer 240. The thinning process in the disclosed embodiments may reduce the damages on the channel part 231 caused by the etching process, and may easily control the width of the channel part 231. In another embodiment, the thinning process may include performing a thinning etching process on the channel region of the fin using the isolation structure as a mask. The thinning etching process may include one or more of an isotropic drying etching process and a wet etching process.

The channel part 231 may be formed by performing the thinning process on the channel region A of the fin 230. The width of the channel part 231 may be smaller than the width of the heat-dissipation part 232. The channel part with substantially small width 231 may increase the control effect of an electric field applied to the channel part 231 on the carriers in the channel part 231 during the operation of the formed semiconductor structure. In addition, the heat-dissipation part 232 with substantially large width may increase the release of heat generated in the channel part 231, thereby improving the heat-dissipation performance of the formed semiconductor structure.

Figure 10:
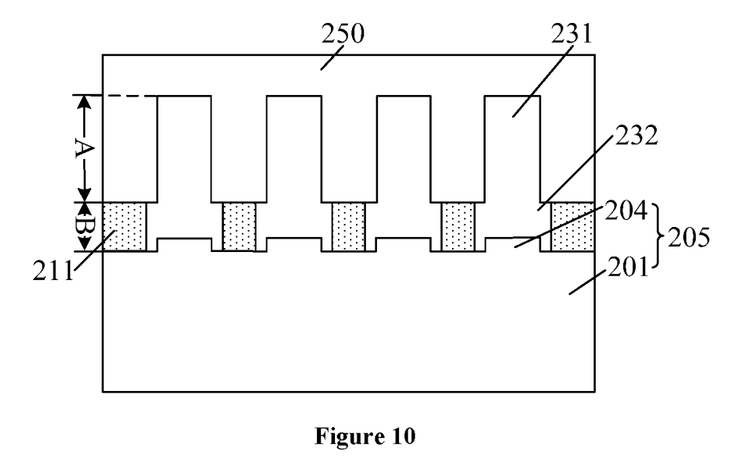

Returning to FIG. 12, after removing the oxide layer, a gate structure may be formed (S109). FIG. 10 illustrates a corresponding semiconductor structure.

Referring to FIG. 10, after performing the thinning process, a gate structure 250 may be formed. The gate structure 250 may be across a length portion of the channel part 231, and may cover a portion of each of the sidewall and top surfaces of the channel part 231.

In one embodiment, the formed semiconductor structure may be a MOS transistor. In another embodiment, when the formed semiconductor structure is a diode, or a triode, the gate structure may not be formed.

In one embodiment, the width of the channel part 231 may be substantially small, such that the entire channel part 231 may be inverted during the operation of the formed semiconductor structure, and the control effect of the gate structure 250 over the carriers in the channel part 231 may increase. The heat-dissipation part 232 with substantially large width may increase the release of heat generated in the channel part 231.

The gate structure 250 may include a gate dielectric layer across the length portion of channel part 231. The gate dielectric layer may cover a portion of each of the sidewall and top surfaces of the channel part 231. The gate structure 250 may also include a gate electrode on the gate dielectric layer.

The gate dielectric layer may be made of silicon oxide, or a high-k dielectric material. The high-k dielectric material may include $HfO_2$, $La_2O_3$, HfSiON, $HfAlO_2$, $ZrO_2$, $Al_2O_3$, or $HfSiO_4$, etc. The gate electrode may be made of polysilicon, or a metal. The metal may include Al, Cu, Ag, Au, Ni, Ti, W, WN, or WSi, etc.

Figure 11:
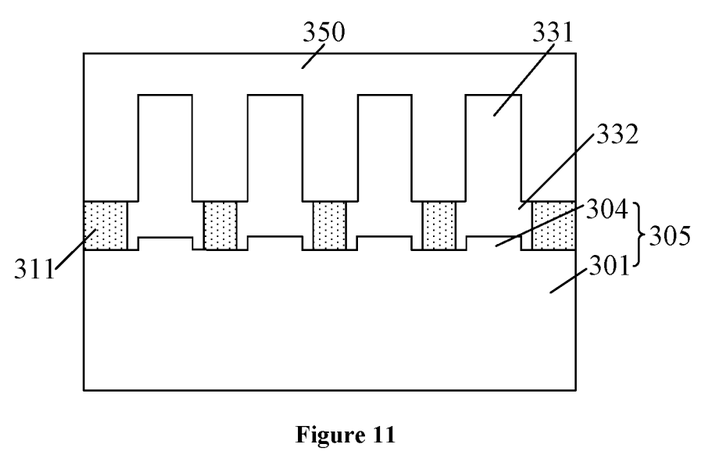
FIG. 11 illustrates a structural schematic of an exemplary semiconductor structure consistent with various disclosed embodiments of the present disclosure.

Accordingly, the present disclosure also provides a semiconductor structure. FIG. 11 illustrates a cross-sectional view of the semiconductor structure. Referring to FIG. 11, the semiconductor structure may include a substrate 305, a fin heat-dissipation region 332 on the substrate 305, and a fin channel part 331 on the fin heat-dissipation region 332. The fin channel part 331 may have a width smaller than the fin heat-dissipation region 332. The semiconductor structure may also include an isolation structure 311 on the substrate 305. A surface of the isolation structure 311 may be coplanar with a top surface of the fin heat-dissipation region 332.

The substrate 305 may include a base substrate 301 and a fin substrate 304 on the base substrate 301. In another embodiment, the substrate may merely include the base substrate.

In one embodiment, the fin channel part 331 may be made of a same material as the fin heat-dissipation region 332. The fin channel part 331 and the fin heat-dissipation region 332 each may be made of silicon germanium, or a single crystal formed by one or more Group III-V elements.

The width of the fin heat-dissipation region 332 may be in a range of approximately 10 nm-25 nm, and the width of the fin channel part 331 may be in a range of approximately 8 nm-15 nm. A height of the fin heat-dissipation region 332 may be in a range of approximately 200 Å-1000 Å, and a height of the fin channel part 331 may be in a range of approximately 300 Å-600 Å.

In one embodiment, the semiconductor structure may further include a gate structure 350 across a length portion of the fin channel part 331. The gate structure 350 may cover a portion of each of sidewall and top surfaces of the fin channel part 331.

In the disclosed method for forming the semiconductor structure, a channel part may be formed by performing the thinning process on the channel region of the fin. The width of the channel part may be smaller than the width of the heat-dissipation part. The channel part with substantially small width may increase the control effect of the electric field applied to the channel part over the carriers in the channel part during the operation of the formed semiconductor structure. In addition, the heat-dissipation part with substantially large width may increase the release of heat generated in the channel part, thereby improving the heat-dissipation performance of the formed semiconductor structure.

In the disclosed semiconductor structure, the width of the fin channel part may be smaller than the width of the fin heat-dissipation region. The fin channel part with substantially small width may increase the control effect of the electric field applied to the channel part over the carriers in the fin channel part during the operation of the formed semiconductor structure. In addition, the fin heat-dissipation region with substantially large width may increase the release of heat generated in the fin channel part, thereby improving the heat-dissipation performance of the formed semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    forming an isolation layer on a substrate, wherein
        the substrate includes a base substrate and a fin substrate on the base substrate,
        the isolation layer includes an opening, and
        a bottom of the opening exposes the base substrate, a top surface of the fin substrate, and side surfaces of the fin substrate;
    forming a fin in the opening over the fin substrate covering the base substrate, the top surface of the fin substrate, and the side surfaces of the fin substrate, wherein
    the fin includes a heat-dissipation region and a channel region on the heat-dissipation region, wherein the heat-dissipation region surrounds and completely covers the top surface of the fin substrate, and the side surfaces of the fin substrate, and
    a width of the fin in a direction perpendicular to an extending direction of the fin is greater than a width of the fin substrate in the direction perpendicular to the extending direction of the fin;
    forming an isolation structure by removing a thickness portion of the isolation layer, wherein a top surface of the isolation structure is coplanar with an interface surface between the heat-dissipation region and the channel region of the fin, and a bottom surface of the isolation structure is coplanar with a bottom surface of the heat-dissipation region; and
    forming a channel part from the channel region by performing a thinning process to reduce a width of the channel region of the fin using the isolation structure as a mask, wherein the heat-dissipation region of the fin forms a heat-dissipation part.

2. The method according to claim 1, wherein forming the isolation layer on the substrate includes:
    providing an initial substrate, wherein the initial substrate includes the base substrate and a sacrificial fin on the base substrate;
    forming the isolation layer on the base substrate, wherein the isolation layer covers sidewalls of the sacrificial fin and exposes a top of the sacrificial fin; and
    removing at least a portion of the sacrificial fin by etching the initial substrate using the isolation layer as a mask to form the substrate and the opening in the isolation layer, wherein:
        the substrate includes the base substrate and the fin substrate.

3. The method according to claim 2, before forming the fin, further including:
    performing a widening etching process on sidewalls of the opening to increase a width of the opening.

4. The method according to claim 3, wherein the widening etching process includes:
    one of a wet etching process and an isotropic dry etching process.

5. The method according to claim 2, wherein:
    a quantity of sacrificial fins is more than one;
    a width of the sacrificial fin is in a range of approximately 8 nm-15 nm; and
    a distance between adjacent sacrificial fins is in a range of approximately 25 nm-50 nm.

6. The method according to claim 1, wherein forming the isolation layer on the substrate includes:
    providing the substrate;
    forming an initial isolation layer on the substrate; and
    forming the isolation layer and the opening in the isolation layer by etching a portion of the initial isolation layer.

7. The method according to claim 1, wherein the thinning process includes:
    forming an oxide layer on a surface of the channel region of the fin by performing an oxidation treatment on the channel region of the fin; and
    removing the oxide layer.

8. The method according to claim 7, wherein the oxidation treatment includes:
one of a plasma oxidation treatment and a rapid thermal oxidation treatment.

9. The method according to claim 7, wherein:
the oxidation treatment includes a plasma oxidation treatment; and
process parameters of the oxidation treatment include:
reactants including $N_2$ and $O_2$,
an etching temperature in a range of approximately 700° C.-1000° C.,
an etching duration in a range of approximately 8 seconds-200 seconds,
a gas pressure in a range of approximately 50 torr-300 torr, and
a flow ratio of $O_2$ over $N_2$ in a range of approximately $1/20$-$1/5$.

10. The method according to claim 7, wherein:
a thickness of the oxide layer is in a range of approximately 5 Å-30 Å.

11. The method according to claim 7, wherein removing the oxide layer includes:
one or more of a wet etching process and an isotropic dry etching process.

12. The method according to claim 1, wherein the thinning process includes:
performing a thinning etching process on the channel region of the fin using the isolation structure as a mask, wherein the thinning etching process includes one or more of an isotropic drying etching process and a wet etching process.

13. The method according to claim 1, wherein:
a width of the channel part is in a range of approximately 8 nm-15 nm.

14. The method according to claim 1, wherein:
a width of the heat-dissipation part is in a range of approximately 10 nm-25 nm.

15. The method according to claim 1, wherein:
the fin is made of one of silicon germanium and a single crystal formed by one or more Group III-V elements.

16. The method according to claim 1, wherein:
a depth of the opening is in a range of approximately 800 Å-2000 Å;
a height of the heat-dissipation part is in a range of approximately 200 Å-1000 Å; and
a height of the channel part is in a range of approximately 300 Å-600 Å.

17. The method according to claim 1, wherein:
the width of the channel region of the fin is reduced in a direction perpendicular to an extension of the fin and parallel to a top surface of the substrate.

18. The method according to claim 1, wherein:
a width of the channel part is smaller than a width of the heat-dissipation region of the fin.

19. The method according to claim 1, further including:
forming a gate structure across a length portion of the channel part, wherein the gate structure covers a top surface and side surfaces of the channel part, a top surface of the isolation structure, and a top surface of the heat-dissipation part.

* * * * *